US006003863A

United States Patent [19]
Barringer et al.

[11] Patent Number: 6,003,863
[45] Date of Patent: Dec. 21, 1999

[54] APPARATUS AND METHOD FOR CONVEYING A FLEXIBLE SHEET THROUGH MANUFACTURING PROCESSES

[75] Inventors: Wayne Albert Barringer, Boca Raton; Alfred Stanley Decker, Ocala, both of Fla.

[73] Assignee: International Business Machines Corporation, Armonk, N.Y.

[21] Appl. No.: 08/814,385

[22] Filed: Mar. 11, 1997

[51] Int. Cl.$^6$ .............................. B65H 5/12; B65H 5/00; B65G 59/02
[52] U.S. Cl. ...................... 271/267; 271/10.01; 271/11; 271/107; 271/90; 271/267; 414/797
[58] Field of Search .................................. 271/10.01, 11, 271/107, 90, 267; 414/797, 227, 467; 38/102.91, 102.1; 269/21; 395/82; 112/470.28

[56] References Cited

U.S. PATENT DOCUMENTS

| | | | |
|---|---|---|---|
| 4,667,944 | 5/1987 | Althouse | 269/21 |
| 4,711,014 | 12/1987 | Althouse | 29/412 |
| 4,788,326 | 11/1988 | Althouse et al. | 414/786 |
| 5,136,797 | 8/1992 | Hildebrandt | 38/102.91 |
| 5,247,395 | 9/1993 | Martinez | 359/883 |

OTHER PUBLICATIONS

27535, Work Board For Flexible Circuitry, Research Disclosure, Mar. 1987, No. 275, Kenneth Mason Publications, Ltd, England.

New Product Bulletin: GEL–PAK Film Products, GEL–PAK, A Division of Vichem Corporation.

*Primary Examiner*—Donald P. Walsh
*Assistant Examiner*—Daniel Keith Schlak
*Attorney, Agent, or Firm*—Richard A. Tomlin; Ronald V. Davidge

[57] ABSTRACT

A flexible sheet to which manufacturing processes are to be applied is tensioned within a carrying fixture having tacky surfaces to which the flexible sheet is fastened. One version of the fixture includes an "L"-shaped attachment surface on a frame member and two tensioning members deflected toward the frame member in mutually perpendicular directions. When the flexible sheet has been fastened to the carrying fixture, the tensioning members are allowed to return toward their undeflected positions while applying tensioning forces to the flexible sheet. Another version of the fixture includes "L"-shaped attachment surfaces on both a frame member and a tensioning member. A loading station includes a stack of unprocessed flexible sheets, a fixture for deflecting tensioning member(s) within the carrying fixture, and a robot arm moving a transport fixture capable of carrying a flexible sheet and a carrying fixture. An unloading station includes a stack to processed flexible sheets, a fixture at which processed flexible sheets are separated from the carrying fixtures, and a similar robot arm with a similar transport fixture. A lower conveyor carries loaded fixtures from the loading station to the unloading station. An upper conveyor carries empty fixtures from the unloading station to the loading station.

16 Claims, 8 Drawing Sheets

APPARATUS AND METHOD FOR CONVEYING A FLEXIBLE SHEET THROUGH MANUFACTURING PROCESSES

CROSS-REFERENCE TO A RELATED APPLICATION

This application is related to a co-pending application, filed on the same day as the present application, and having a common assignee therewith, entitled "Fixture and Method for Conveying a Fixture Holding a Flexible Sheet through Manufacturing Processes," having issued as U.S. Pat. No. 5,891,295.

BACKGROUND OF THE INVENTION

1. Field of the Invention

This invention relates to apparatus for transporting a flexible sheet through manufacturing processes, and, more particularly, to apparatus for loading a flexible sheet onto a frame, for transporting the flexible sheet with the frame through the process and for removing the flexible sheet from the frame.

2. Background Information

Processes applied during the manufacture of flexible circuits, which are applied, for example, to polyimide sheets having a thickness of 0.002 inch (0.08 mm), require the holding and tensioning of such sheets as membranes having sides up to 14 inches (35.6 cm) long. Such circuits, and the sheets from which they are made, must be held as they go through one or more chemical process steps during manufacture.

Present methods for holding circuit sheets as they are carried through chemical processes include the use of double-sided adhesive tape, pins, springs, clamps, and screws. (Hereinafter, the term "circuit sheet" is meant to describe a flexible sheet being prepared for the application of circuit traces, a flexible sheet to which circuit traces are being applied, or a flexible sheet to which circuit traces have been applied). Double-sided adhesive tape used to fasten a flexible sheet or circuit to a frame member must frequently be replaced on the frame member, in an operation which is often difficult because the tape cannot easily be removed completely and cleanly. Furthermore, such tape frequently transfers an adhesive residue to the product being manufactured. Mechanical clamping methods tend to be complex, expensive to build, and difficult to maintain. Such mechanisms may collect and retain solutions from various chemical processes, resulting in a need for frequent and difficult cleaning, in corrosion problems, and, sometimes, in the contamination of one chemical process with residual materials from another such process. Furthermore, such conventional clamping mechanisms often require special features in the product being manufactured, such as clearance holes for clamping pins or screws. In some instances, difficulties are encountered because the thin sheet product is not clamped uniformly, being allowed to sag or billow between conventional clamping devices.

Thus, what is needed is a frame, to which a flexible sheet can easily be attached, and from which the circuit sheet can easily be removed, having a capability to maintain membrane tension within the circuit sheet as it is carried through various chemical processes. It is particularly desirable that such a frame be composed of materials resistant to chemical attack, and that such a frame be configured to avoid presenting surfaces including notches or cavities to the chemical processes through which the circuit sheet may be carried, since such features tend to collect chemical residue and are difficult to clean. It is further desirable to provide attachment means usable with a number of different types of circuit sheets without placing requirements on such sheets for special features, such as attachment holes. Such a frame is needed for the chemical processing of flexible circuit sheets and for the processing of other types of flexible sheets.

3. Description of the Prior Art

A work board for holding a flexible circuit flat to provide compatibility with automated, robotic assembly and handling during the manufacturing processes of building a populated working flexible circuit is described in Article 37535, *RESEARCH DISCLOSURE*, March, 1987, number 275, Kenneth Mason Publications Ltd., England. This work board includes a frame having two holes, spaced at midpoints along opposite sides, receiving pins extending through holes in the flexible circuit to locate the circuit. At each corner of the work board, a spring-loaded, low profile slider hooks into an additional hole in the flexible circuit. Thus, the circuit is tensioned by pulling all four corners as it is held in place at mid-points along opposite sides.

However, this work board includes a number of mechanical clamping devices, which must be cleaned, with resulting difficulties, after passage through various types of chemical baths employed in the process of manufacturing flexible circuits populated with components. Furthermore, six special holes must be placed in the circuit being manufactured for engagement with these clamping devices.

A different type of tensioning frame is described in U.S. Pat. No. 5,136,797. This frame assembly, which is used to hold the mesh fabric used for screen printing in a tensioned condition through a number of printing operations, includes adjustable tensioning bars adjacent the frame peripheral edge. Screen mesh fabric is mounted to the tensioning bars by adhesive, and the bars are drawn toward the frame edge by tightening screws extending through holes in the frame edge to engage the bars, In this way, the fabric is stretched to a uniform tautness for printing. Each tensioning bar may also include resilient corner pieces to allow local slackening of the fabric.

While this tensioning frame appears to work well for its intended purpose, it cannot be applied as a practical frame for holding a flexible circuit sheet as it is taken through the various chemical processes involved in the production of a flexible circuit. Each of the four sides of the frame comprises a metal channel, in which drive screws move bars with flexible corner pieces. This type of structure includes a number of places in which chemical residues can be easily trapped, causing the types of problems described above. In the printing process for which this tensioning frame is intended, ink is typically applied, using a squeegee, to the central portion of the mesh screen, along the image to be printed. There is little if any contamination by ink within the cavity formed by the frame channels.

U.S. Pat. Nos. 4,667,944, 4,711,041, and 4,778,326 describe apparatus for handling semiconductor chips and like objects. In U.S. Pat. Nos. 4,667,944 and 4,711,044, the object to be handled is placed on a flat flexible film that is supported on a flat, porous texturized porous texturized fabric sheet, such as a woven or knit fabric having spaced fiber crossovers. In U.S. Pat. No. 4,778,326, the object to be handled is attached to the face of a base member, with the face being formed with recesses covered by the flat flexible film. In the apparatus of all three patents, objects are supported on the flat flexible film in intimate surface contact therewith for securely holding the same in position by interfacial forces therebetween. Adhesive may be included for increasing the interfacial force. To facilitate removal of objects from the film, the fabric of U.S. Pat. Nos. 4,667,944 and 4,711,041 is connected to a vacuum source for drawing portions of the flexible film over and between crossovers in the fabric. Similarly, the recesses of the face of the base member described in U.S. Pat. No. 4,778,326 are connected to a vacuum source, drawing portions of the flexible film into the recesses and providing the film with a textured, or undulating surface. In any case, the application of a vacuum causes portions of the film to be withdrawn from the object being held, reducing the area of contact between the flexible film and the object being held, and hence the interfacial forces therebetween. In this way the removal of the object using a conventional technique is enabled.

While the methods of U.S. Pat. Nos. 4,667,944, 4,711,041, and 4,778,326 are particularly effective in facilitating the handling of small, flat devices, such as semiconductor chips, what is needed is an effective method for handling relatively large flexible sheets. Since the methods of these three patents are designed for small chips, a need to hold flexible sheets in a taut, tensioned condition is not addressed. It is also desirable to avoid the use of a vacuum system, with its ports and cavities, in the configuration of a frame being used to transport flexible sheets through chemical processes. An effective, automated system for attaching flexible sheets to frames holding such sheets in a tensioned condition, for transporting such frames with sheets attached therethrough through manufacturing processes, and for subsequently removing the sheets from the frames is also needed.

SUMMARY OF THE INVENTION

In accordance with one aspect of the invention, there is provided apparatus for carrying a rectangular flexible sheet being maintained in a tensioned condition. The apparatus includes a frame member, a first tensioning member, and a first flexible attachment mechanism. The frame member has a flat "L"-shaped first attachment surface with a tacky coating. The first tensioning member has a flat second attachment surface with a tacky coating. The second attachment surface extends coplanar with the first attachment surface. The first and second attachment surfaces are configured so that the tacky coating on the first attachment surface can be attached to a first peripheral region of a surface of the flexible sheet, while the second attachment surface is attached to a second peripheral region of the surface of the flexible sheet. This first peripheral region extends along edges of the flexible sheet from a first corner of the flexible sheet. The second peripheral region extends along an edge of the flexible sheet opposite this first corner. The first flexible attachment mechanism attaches the first tensioning member to the frame member, permitting motion of the first tensioning member from an undeflected position toward the first attachment surface in a first direction, while providing a force returning the first tensioning member toward the undeflected position.

DETAILED DESCRIPTION

Figure 1:
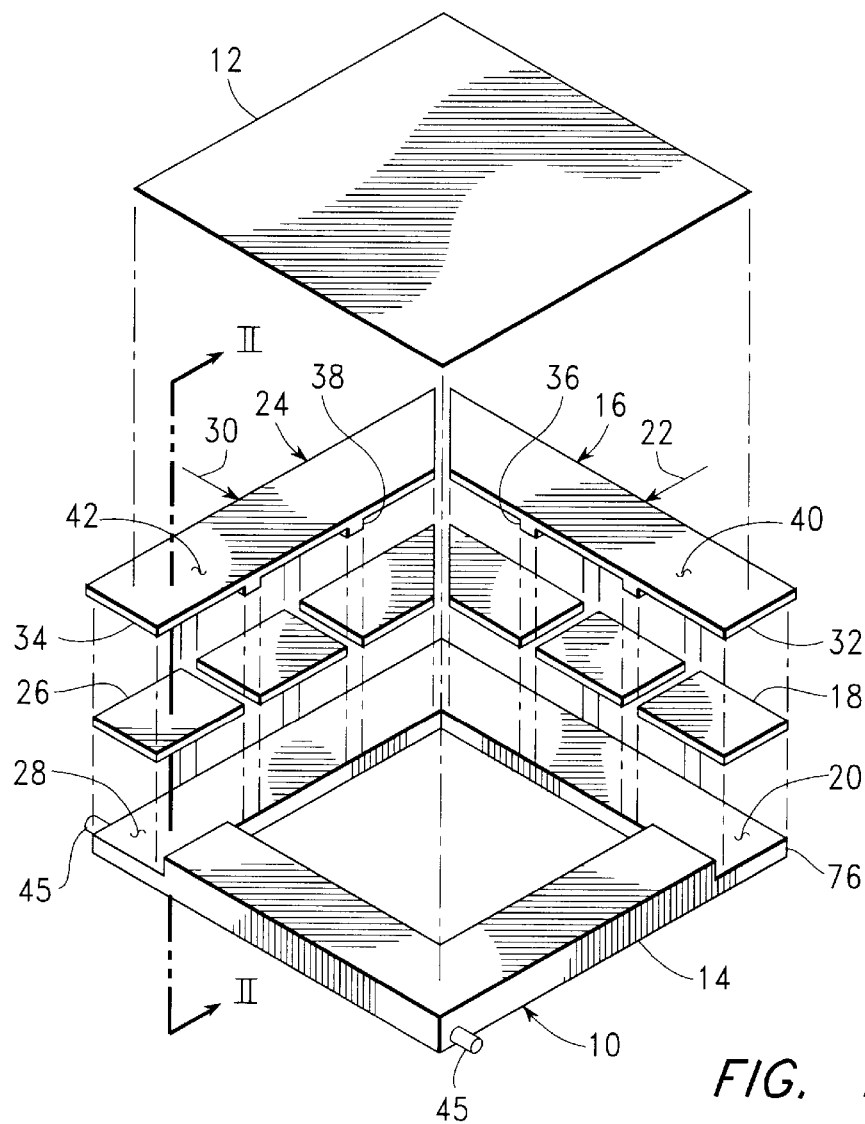
FIG. 1 is an exploded isometric view of a flexible sheet carrying fixture built in accordance with a first version of a first embodiment of the present invention, together with a circuit sheet carried thereby.

FIG. 1 is an exploded isometric view of a flexible sheet carrying fixture 10 built in accordance with a first version of a first embodiment of the present invention, together with a circuit sheet 12 carried thereby. This fixture 10 includes a frame member 14 and a tensioning member 16, which is movably mounted on a number of elastomeric pads 18 to slide along an associated mounting surface 20 of the frame member 14 in an inward direction indicated by arrow 22 and in an outward direction opposite thereto. Similarly, a tensioning member 24 is movably mounted on a number of elastomeric pads 26 to slide along an associated mounting surface 28 of the frame member 14 in an inward direction indicated by arrow 30 and in an outward direction opposite thereto.

The elastomeric pads 18, 26 are adhered to the underlying frame surfaces 20, 28 and to overlying lower surfaces 32, 34 along the tensioning members 16, 24, providing for the attachment of the tensioning members 16, 24 to the frame member 14 as well as for the generation of sheer forces opposing movement in the directions of arrows 22, 30 and opposite thereto. The elastomeric pads 18 are separated by sliding blocks 36, which descend as integral portions of the tensioning member 16 to assure that motion occurs in a straight line as the member 16 is moved in or opposite the direction of arrow 22. Similarly, elastomeric pads 26 are separated by sliding blocks 38, which descend as integral portions of the tensioning member 24 to assure that motion occurs in a straight line as the member 24 is moved in or opposite the direction of arrow 30.

The upper surface 40 of tensioning member 16, the upper surface 42 of tensioning member 24, and the upper surface 44 of frame member 14 are partially or completely covered with a tacky layer permitting the repeated attachment and removal of flexible circuit sheets 12. This tacky layer is, for example, composed to a tacky film attached to the upper surfaces 40, 42, 44. A material suitable for this purpose has been found to be a film sold under the trademark GEL-PAK by Vichem Corporation of Sunnyvale, Calif. This film is supplied with an adhesive layer on one side, and with an elastomeric material exposing a tacky surface at the other side. This film can be optimized for a particular application, with variations being made in the thickness of the film and in its level of adhesion, or tackiness. Many repeated applications and removals of a product, such as the flexible sheet 12, are possible, up to a limiting number determined by the time when the outer surface of the tacky film becomes contaminated. For the application of repeatedly attaching flexible sheets 12 to fixture surfaces, 40, 42, 44, a GEL-PAK 8 film having a thickness of 0.02 inch (0.5 mm) has been found to be successful.

The elastomeric pads 18, 26 may also be composed of a GEL-PAK film layer, which is preferably about 0.04 inch (1 mm) thick. In this application, the film layer includes a pressure sensitive adhesive on each side for attachment to the adjacent surfaces of frame member 14 and of tensioning members 16, 24.

While the tacky surfaces necessary for adhesion of flexible sheets 12 to the fixture 10 may be formed using a number of tacky coatings or pressure sensitive tapes, and while the elastomeric pads 18, 26 may be formed using a number of well-known elastomeric materials, including silicone rubbers, the use of GEL-PAK films in these applications is desirable because of the tacky surface and elastomeric core properties of these materials and because these films are particularly resistant the chemicals used to treat flexible films in the fabrication of flexible circuits.

The frame member 14 preferably also includes a pair of pins 45 extending outward from opposite sides near an edge. These pins 45 are used in a manner which will be described in reference to FIGS. 12A and 12B to provide a simple means for removably attaching the flexible sheet carrying fixture 10 to a conveyor system, so that this fixture 10, and the flexible sheet 12 attached to it can be easily carried through manufacturing processes.

The frame member 14 and tensioning members 16, 24 may be composed of aluminum, such as Type 6061 aluminum, having a corrosion-resistant coating. Satisfactory results have been achieved using a coating sold by the DuPont Corporation under the trademark DYKOR. These members 14, 16, 24 may alternately be composed of a stainless steel having a corrosion-resistant coating, such as DYKOR.

Figure 2:
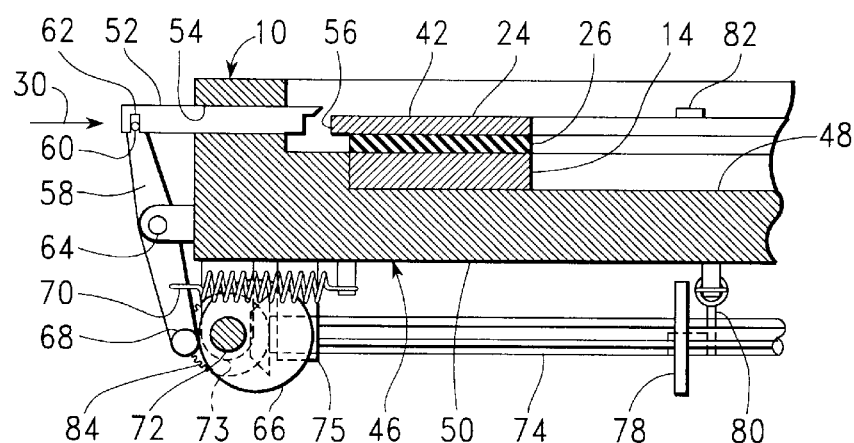
FIG. 2 is a fragmentary cross-sectional view of the carrying fixture of FIG. 1, taken as indicated by section lines II—II in FIG. 1, together with a loading fixture also built in accordance with the first embodiment of the present invention, shown in an initial state with the carrying fixture placed in the loading fixture.
Figure 3:
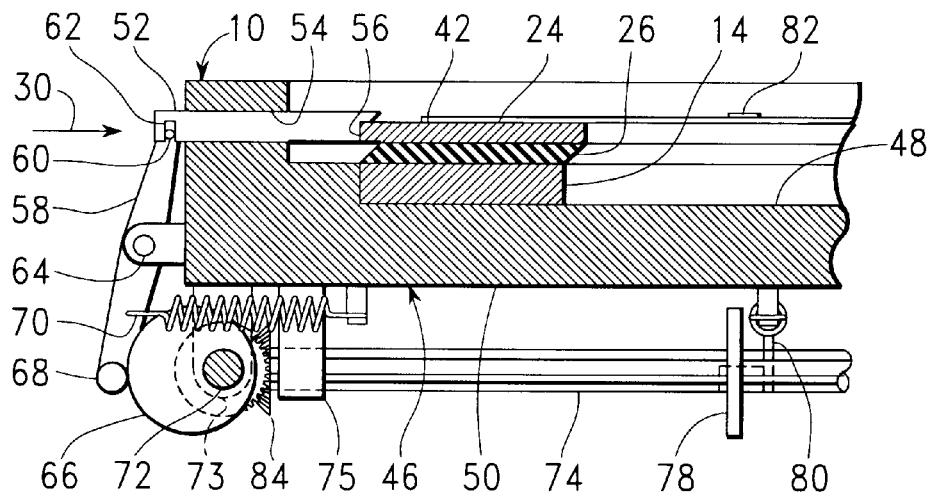
FIG. 3 is a view similar to FIG. 2, except that the fixtures are shown in a loading state, with the loading fixture deflecting tensioning members of the carrying fixture inward for loading the circuit sheet into the carrying fixture.
Figure 4:
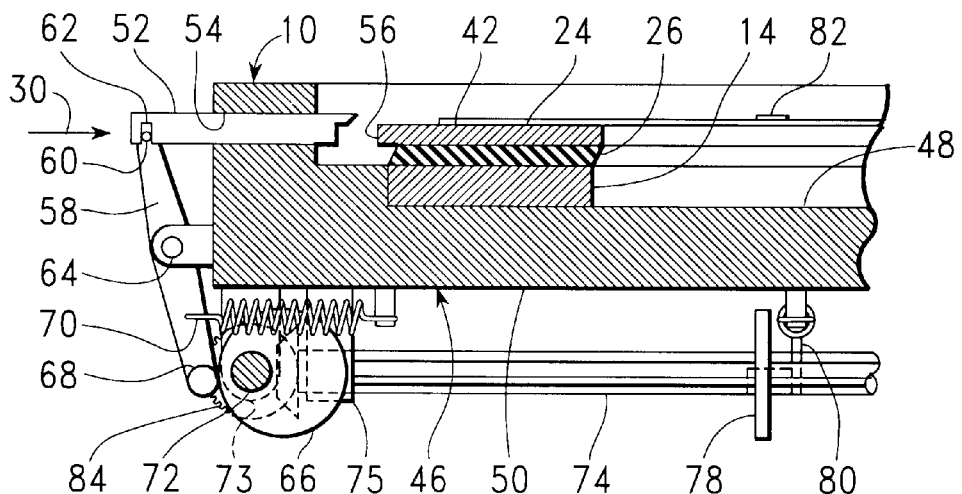
FIG. 4 is a view similar to FIG. 2, except that the fixtures are shown in a released state, with the carrying fixture being released by the loading fixture for carrying the attached circuit sheet.

FIGS. 2–4 are fragmentary cross-sectional views of the carrying fixture 10 of FIG. 1, taken as indicated by section lines II—II in FIG. 1, together with a loading fixture 46, also built in accordance with a first embodiment of the present invention. The carrying fixture 10 is placed in a receiving cavity 48 within a loading platform 50 of the loading fixture 46. The loading fixture 46 includes a number of pushrods 52, slidably mounted in slots 54 of the loading platform 50, being spaced along the outer edge 56 of tensioning member 24. Each pushrod 52 is engaged by a drive crank 58, with a pin 60 of the crank extending within a slot 62 of the pushrod. The drive crank 58, which is in turn pivotally mounted on a pin 64, is driven by a cam 66 engaging a follower roller 68 on the crank 58. An extension spring 70 holds the roller 68 against cam 66 at all times. Each cam 66 is driven in rotation by a drive shaft 72, which turns within bearing blocks 73.

In FIG. 2, the fixtures 10, 46 are shown in an initial state, with pushrods 52 being withdrawn outward, opposite the direction of arrow 30, to allow insertion of the carrying fixture 10 into the cavity 48.

In FIG. 3, the fixtures 10, 46 are shown in a loading state with pushrods 52 being moved inward, in the direction of arrow 30, by the rotation of cam 66, so that the tensioning member 24 is displaced inward, with the elastomeric pads 26 being placed in a state of shear strain. In this state, the flexible circuit sheet 12 is placed atop the upper surface 42 of tensioning member 24, being held thereto by the tacky layer thereon, as described above in reference to FIG. 1.

In FIG. 4, the fixtures 10, 46 are shown in a released state, with pushrods 52 being returned outward, opposite the direction of arrow 30, by the rotation of cam 66, making fixture 10 ready for removal from the loading fixture 46, with flexible circuit sheet 12 being held in attachment to the tensioning member by the tacky layer on its upper surface 42. The shear stresses placed in elastomeric pads 26 within the loading state described above in reference to FIG. 3 are partially relieved as the flexible circuit sheet 12 deflects in tension. The remaining sheer stresses in elastomeric pads 26 continue to hold this sheet 12 in tension after the holding fixture 10 is removed from the loading fixture 46, and during subsequent processing of the sheet 12.

Referring additionally to FIG. 1, while the above discussion in reference to FIGS. 2–4 has particularly described the movement of tensioning member 24 in and opposite the direction of arrow 30, it is understood that tensioning member 16 is moved similarly and simultaneously in and opposite the direction of arrow 22. This movement is achieved through the use of a drive shaft 74 rotating in bearing blocks 75 and extending under the loading platform 50 along the edge 76 thereof, to turn a number of cams 78, causing drive arms 80 to pivot in the manner generally described above in reference to drive arms 58, so that pushrods 82 are moved in and opposite the direction of arrow 22. Both drive shafts 72, 74 are driven through a clutch (not shown) providing incremental rotation from a motor driven shaft. These shafts 72, 74 are mechanically connected by a pair of meshing bevel gears 84.

Figure 5:
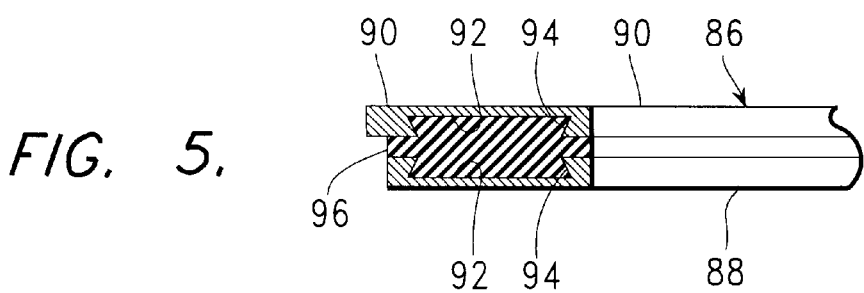
FIG. 5 is a fragmentary cross-sectional view of an alternative carrying fixture, built in accordance with a second version of the first embodiment of the present invention.

FIG. 5. is a fragmentary cross-sectional view of an alternative carrying fixture 86, for carrying a flexible circuit sheet, built in accordance with a second version of the first embodiment of the present invention. This alternative carrying fixture 86 is similar in construction and use to the carrying fixture 10, which has been described above in reference to FIGS. 1–4, except that, in fixture 86, the frame member 88 and tensioning members 90 include cavities 92 with inward-extending ledges 94. An elastomeric resin 96 is molded in place, being held by interlocking with these ledges 94 well as by adhesive forces developed between the elastomeric resin and the cavities 92.

Referring to FIGS. 2 and 5, the carrying fixtures built according to the first and second version of the first embodiment of the present invention, i.e. carrying fixtures 10 and 86, are operable in the same type of loading fixture 46. If these carrying fixtures 10, 86 are built to the same exterior dimensions, they may be loaded in the same loading fixture 46.

Figure 6:
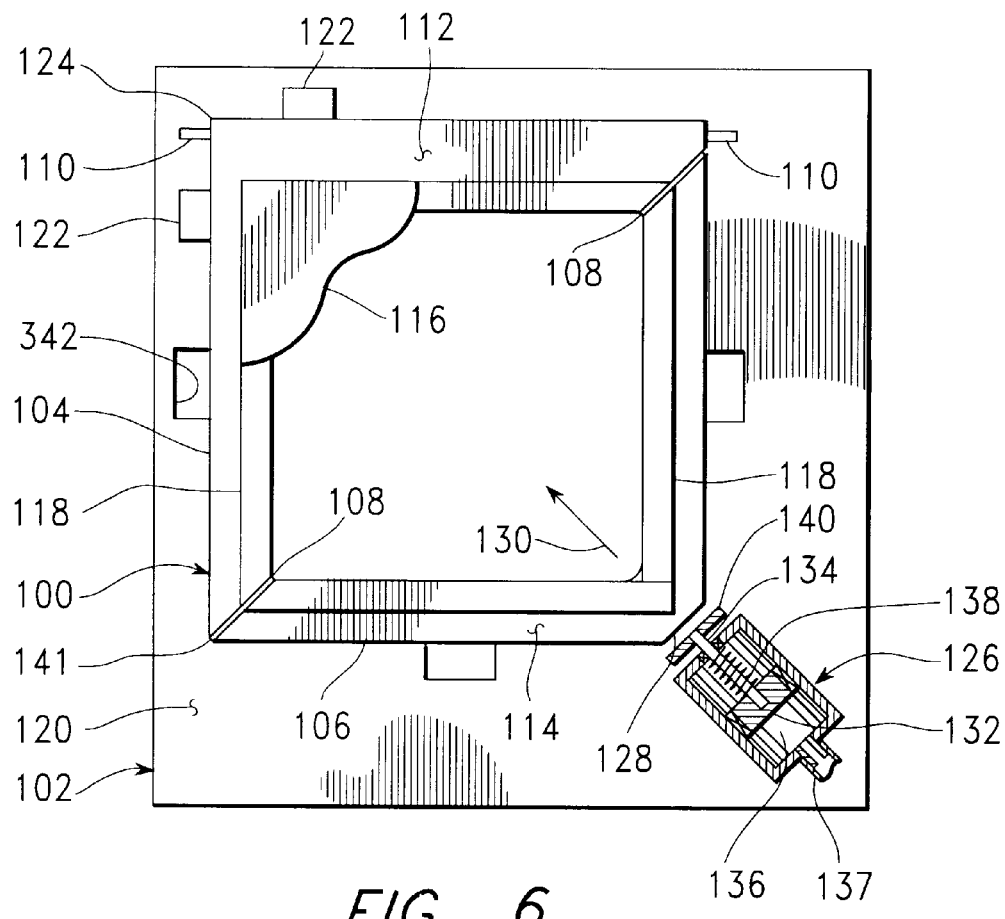
FIG. 6 is a plan view of a flexible sheet carrying fixture built in accordance with a first version of a second embodiment of the present invention, together with a loading fixture built in accordance with the second embodiment of the present invention.

FIG. 6 is a plan view of a flexible sheet carrying fixture 100 built in accordance with a first version of a second embodiment of the present invention, together with a loading fixture 102 also built in accordance with the second embodiment of the present invention. The carrying fixture 100 includes an L-shaped frame member 104 and an L-shaped tensioning member 106, which are elastically joined along mitered edges with a pair of elastomeric pads 108. The frame member 104 also includes a pair of outward-extending, coaxially-aligned pins 110, which are provided to facilitate transporting the carrying of fixture 100 within a conveyor system, in a manner which will be explained in reference to FIG. 9. The upper surface 112 of frame member 104 and the upper surface 114 of tensioning member 106 are partially or completely coated to provide a tacky surface on which a flexible sheet 116 is placed for subsequent processing.

As previously described in reference to FIG. 1, suitably tacky surfaces may be provided through the application of film strips 118, composed of a film material sold by Vichem Corporation of Sunnyvale, Calif. under the trademark GEL-PAK, having a thickness of 0.02 inch (0.5 mm). The elastomeric strips 108 may also be composed of a GEL-PAK film, in this case having a thickness of 0.08 inch (2 mm) and a pressure-sensitive adhesive on each side. Also as previously described in reference to FIG. 1, the frame member 104 and tensioning member 106 are preferably composed of aluminum or stainless steel coated with a corrosion resistant material, such as the coating sold by the DuPont Corporation under the trademark DYKOR.

The loading fixture 102 includes a flat surface 120 on which the carrying fixture 100 is placed for loading the flexible sheet 116. The carrying fixture 100 is placed against a pair of locating blocks 122 extending upward from the flat surface 120, determining the location of a stationary corner 124 of frame member 104, while a pneumatic actuator 126 is used to drive movable corner 128 of tensioning member 106 inward, in the direction of arrow 130.

The pneumatic actuator 126 may be constructed in a number of ways well known to those skilled in the art. In the example of FIG. 6, a piston 132 moves with a sliding rod 134 in the direction of arrow 130 when air under pressure is admitted into a chamber 136 through a hose connection 137, and opposite the direction of arrow 130, with a force provided by a compression spring 138, when air is exhausted from the chamber 136 through the hose connection 137. A sliding block 140, which is also attached to the sliding rod 134, is positioned to engage the movable corner 128 when the rod 134 is thus moved in the direction of arrow 130.

When the carrying fixture 100 is first placed on the loading fixture 102, the sliding block 140 is held in the direction opposite the indication of arrow 130, with a clearance being maintained between the sliding block 140 and the adjacent movable corner 128. Next, the actuator 126 is operated to drive this block 140 inward, in the direction of arrow 130, with tensioning member 106 also moving inward as elastomeric pads 108 are compressed. As the tensioning member 106 is thus held inward by the actuator 130, the flexible sheet 116 is placed atop the carrying frame 100, being held in place by contact with the tacky surface of film strips 118. Next, the actuator 126 is released, so that sliding block 140 moves outward, opposite the direction of arrow 130, disengaging movable corner 128. As this occurs, the movement of tensioning member 106 is limited by the tensioning of flexible sheet 116. Then, this sheet 116 is maintained in tension, during the application of various subsequent manufacturing processes, by compressive stresses remaining within the elastomeric pads 108.

Figure 7:
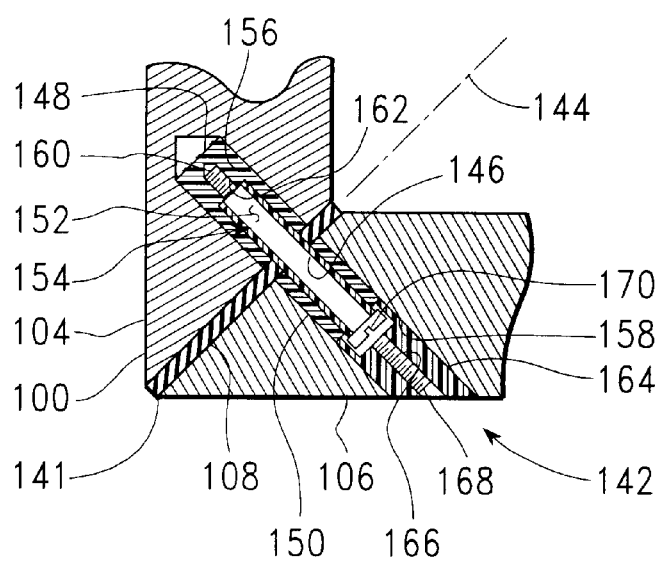
FIG. 7 is a fragmentary cross-sectional plan view of the carrying fixture of FIG. 6, taken to show a sliding assembly at a corner of the fixture.

FIG. 7 is a fragmentary cross-sectional plan view of the carrying fixture 100, taken at a flexible corner 141 of the fixture 100 to show a slider assembly 142 used to restrict relative motion between the frame member 104 and tensioning member 106.

In the absence of these slider assemblies 142, other forms of relative motion between these members 104, 106 at the interfaces therebetween, established with elastomeric pads 108, may cause various difficulties. For example, torsional deflection of the tensioning member 106 about an axis 144 extending between the two elastomeric pads 108 keeps the fixture 100 from holding the flexible sheet 116 in a stable, flat configuration. Furthermore, such torsional deflection may result in tensile stress levels exceeding the level of such stresses supported by the adhesive holding the elastomeric pads 108 to the members 104, 106, resulting in the separation of these attached elements.

In the slider assembly 142, relative motion occurs as an inner sleeve 146 slides within a first plug 148 and an outer sleeve 150. The inner sleeve 146 fits tightly over a shoulder portion 152 of a screw 154. The first plug 148 fits tightly within a hole 156 in frame member 104. The outer sleeve 150 fits tightly within a hole 158 in tensioning member 106. A threaded end 160 of the screw 154 engages a threaded hole 162 within the first plug 148. Since the screw 154 is relatively difficult to bend, and since a rigid connection between this screw 154 and the first plug 148 through the threaded screw portion 160, relative motion between the frame member 104 and tensioning member 106 is, for practical purposes, limited to the sliding motion allowed by the slippage of inner sleeve 146 within the first plug 148 and the outer sleeve 150.

To inhibit the flow of corrosive materials and contamination into the slider assembly 142, a second plug 164 is pressed into the hole 158 within tensioning member 106. This second plug 164 includes a threaded hole 166 in which a set screw 168 is engaged. If it becomes necessary to replace various parts within the slider assembly 142, or to separate the tensioning member 106 from the frame member 104, the set screw 168 is removed, and a headed screw (not shown) is installed within the threaded hole 166. The head of this new screw is then grasped to facilitate pulling the plug 164 out of hole 158. Alternately, the set screw 168 may be tightened to push against the screw 152, pushing the plug 164 outward. A slot 170 within screw 152 is next engaged using a screwdriver blade (not shown), allowing the screw 152 to be turned and removed.

The screw 152 is preferably composed of stainless steel. The remaining portions within the slider assembly 142 are preferably composed of resinous materials having a high resistance to corrosion, such as PTFE (polytetraflora-ethelene). Suitable materials for this purpose are sold by the DuPont Corporation under the trademark TEFLON.

Thus, the elastomeric strip 108 performs a number of functions. Since it is attached to both the frame member 104 and the tensioning member 106, it provides a means for these members to be attached to one another. Since it extends around the various components of slider assembly 142, it prevents the entry of corrosive materials into this assembly 142. Furthermore, the elastic properties of the strip 108 are used to store energy therein when the tensioning member 106 is moved in the direction of arrow 130 (shown in FIG. 6), with this energy subsequently being used to tension the flexible sheet 116.

Figure 8:
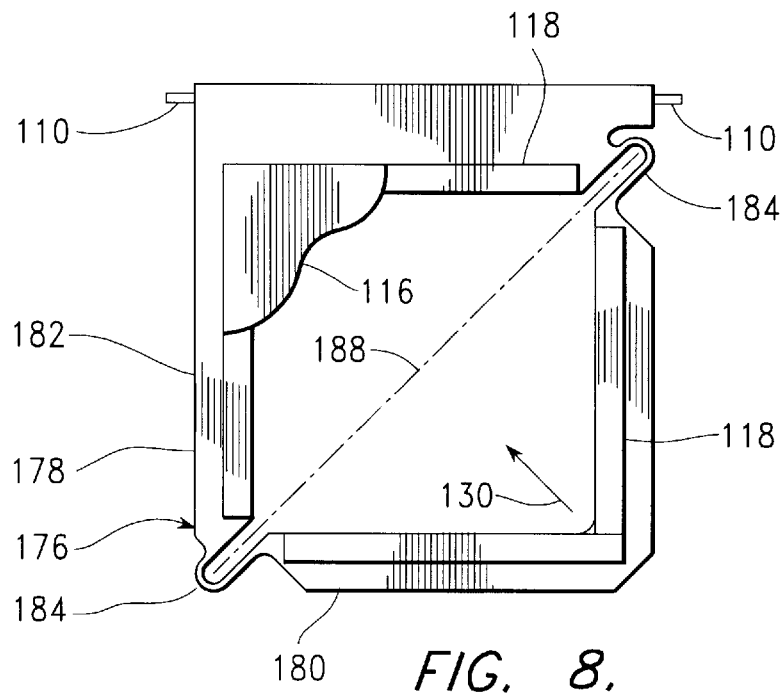
FIG. 8 is a plan view of a flexible sheet carrying fixture built in accordance with a second version of a second embodiment of the present invention.

FIG. 8 is a plan view of an alternative flexible sheet carrying fixture 176 built in accordance with a second version of the second embodiment of the present invention. This fixture 176 is similar to the previously-described carrying fixture 100, except that the frame member 178 and tensioning member 180 of fixture 176 are integral portions of a fixture frame 182, being joined by flexible loops 184, which are also integral portions of the fixture frame 182. Tacky film strips 118 are applied to the frame member 178 and tensioning member 180 as described above in reference to FIG. 6. Pins 110 extend, also as described above, from opposite sides of a leg of the frame member 178.

Continuing to refer to FIG. 8, and referring again to FIG. 6, the flexible sheet carrying fixture 176 is loaded with a flexible sheet in the loading fixture 102. The actuation of pneumatic actuator 142 causes a force to be applied to movable corner 186 in the direction of arrow 130, moving the tensioning member 180 in the direction of arrow 130, toward the frame member 178 with the concurrent deflection of each flexible loop 184. As the carrying fixture 176 is subsequently held in this deflected condition, the flexible sheet 116 is applied atop the tacky film strips 118. Next, the pneumatic actuator 142 is de-activated, so that the carrying fixture 176 returns partly to its undeflected condition, with tensioning member 180 moving opposite the direction of arrow 130, and with tensioning forces being applied to the flexible sheet 116. The flexible loops 184 of carrying fixture 176 are rigid enough in torsion to limit twisting of the carrying fixture 176, for example about a diagonal axis 188, to an acceptable level while permitting an adequate level of deflection of the loops 184 by movement of tensioning member 180 in the direction of arrow 130.

Figures 9, 10:
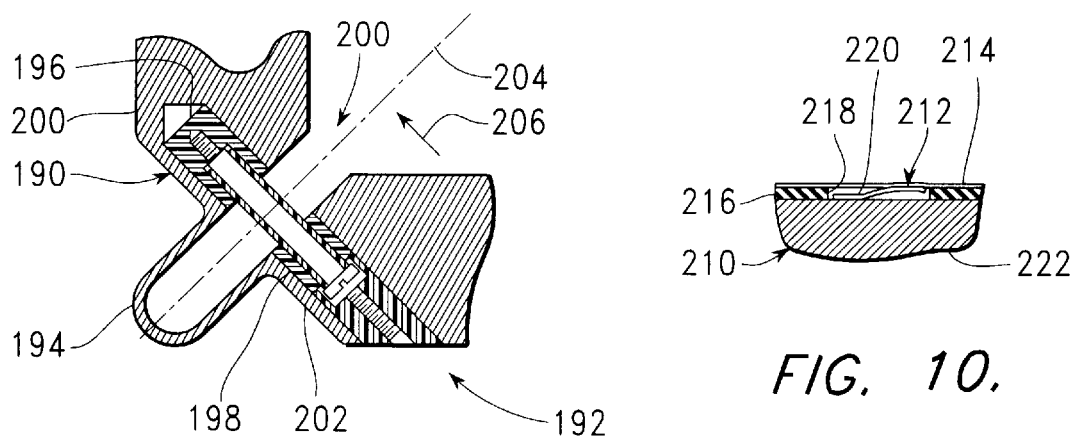
FIG. 9 is a fragmentary cross-sectional plan view showing modifications to include an optional sliding assembly at a corner of the fixture of FIG. 8.
FIG. 10 is a fragmentary cross-sectional elevation of a carrying fixture such as that of FIG. 8, showing an optional contact spring for providing electrical contact to a flexible sheet held by the carrying fixture.

FIG. 9 is a fragmentary cross-sectional plan view of another sheet carrying fixture 190 build in accordance with a third version of the second embodiment of the present invention. This carrying fixture 190 is similar to the carrying fixture 176, which has been described above in reference to FIG. 8, except that a slider assembly 192 is added at each of the diagonally opposite corners having a flexible loop 194. This slider assembly 192 is similar to the slider assembly 142, which has been described above in reference to FIG. 7, except that a first plug 196 and outer sleeve 198 of the slider assembly 192 are separated from one another in a gap 199 which is not surrounded by an elastomeric material. Also, in comparison to carrying fixture 176 of FIG. 8, the shape of frame member 200 of carrying fixture 190 is modified to provide a structure extending around the first plug 196, and the shape of tensioning member 202 is modified to restore the flexibility of loop 194. In a manner corresponding to the previous description given in reference to FIG. 7, the slider assembly 192 prevents twisting of the carrying fixture 190 about a diagonal axis 204 while allowing movement of the tensioning member 202 toward the frame member 200 in the direction of arrow 206.

In some instances it is necessary or desirable to apply an electrical potential (including ground potential) to a surface of a flexible sheet being carried through manufacturing processes. For example, metal can be applied to such a sheet by means of an electroplating process. In accordance with an aspect of the present invention, such a process is facilitated by applying an electrical potential to a surface of the flexible sheet.

Thus, FIG. 10 is a fragmentary vertical cross-sectional view through a carrying fixture 210 having a contact spring 212 positioned to contact an adjacent surface of a flexible sheet 214 applied atop a surrounding tacky strip 216. This strip 216 includes an aperture 218. Since the fixture 210 is carried through the chemical processes to be applied to the flexible sheet 214 only with the sheet 214 attached to the fixture, the contact spring 212 is protected from the chemical processes, being sealed by the adhesion of surrounding portions of the flexible sheet 214 with underlying portions of the strip 216. A base portion 220 of the contact spring 212 is fastened to an underlying structure 222 by means of welding or silver soldering.

Figure 11:
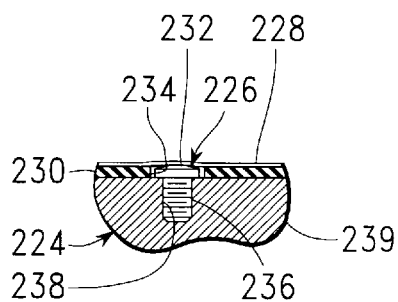
FIG. 11 is a fragmentary cross-sectional elevation of a carrying fixture such as that of FIG. 8, showing an optional contact spring for providing electrical contact to a flexible sheet held by the carrying fixture.

Similarly, FIG. 11 is a fragmentary vertical cross-sectional view through a carrying fixture 224 having a contact post 226 positioned to contact an adjacent surface of a flexible sheet 228 applied atop a surrounding tacky strip 230. In this contact configuration, electrical contact is maintained through local forces holding the flexible sheet 226 in tension, with a curved outer surface 232 of the post 226 extending slightly beyond the surrounding outer surface of tacky strip 226. Since the contact post is within an aperture 234 within the strip 226, it is protected from contact with chemicals applied to the flexible sheet 226 attached to the surrounding tack strip 230. A threaded portion 236 of the contact post 226 engages a threaded hole 238 within an underlying structure 239 to hold the post 226 in place.

Referring to FIGS. 8, 10, and 11, the underlying structures 222, 239 may be, for example, the frame member 178 and/or the tensioning member 180 of carrying fixture 176. A single electrical contact spring 212 or contact post 226 may be used, or a number of such contact devices may be placed around the annular area of the carrying fixture in contact with the flexible sheet 116, in order to provide additional current carrying capability or a balance in current flow. Other carrying structures, as described in reference to FIGS. 1, 6, and 9, may also have this feature to provide electrical contact. As the carrying fixture is taken through a manufacturing process requiring current flow, an electrical connection is made to the pins 110 of the fixture or to another portion of the fixture, using clamps or contacts of various types familiar to those skilled in the art.

Figure 12:
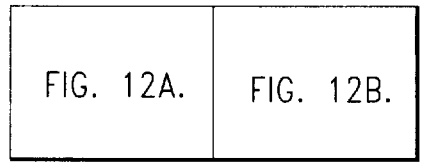
FIG. 12 is an elevation of a conveyor system moving a number of the carrying fixtures of FIG. 8 through a manufacturing process applied to flexible sheets carried thereon.

FIG. 12 is a side elevation of a conveyor system 240 used to move fixtures 176 carrying flexible sheets 116 through a manufacturing process and to return such fixtures 176, without the flexible sheets 116, for reuse. The conveyor system 240 includes a lower conveyor 241, moving fixtures 176 with attached sheets 116 in the direction of arrow 242 through a manufacturing process schematically indicated by a block 243, and an upper conveyor 244, moving empty fixtures 176 above the manufacturing process 243 opposite the direction of arrow 242.

Figure 12A:
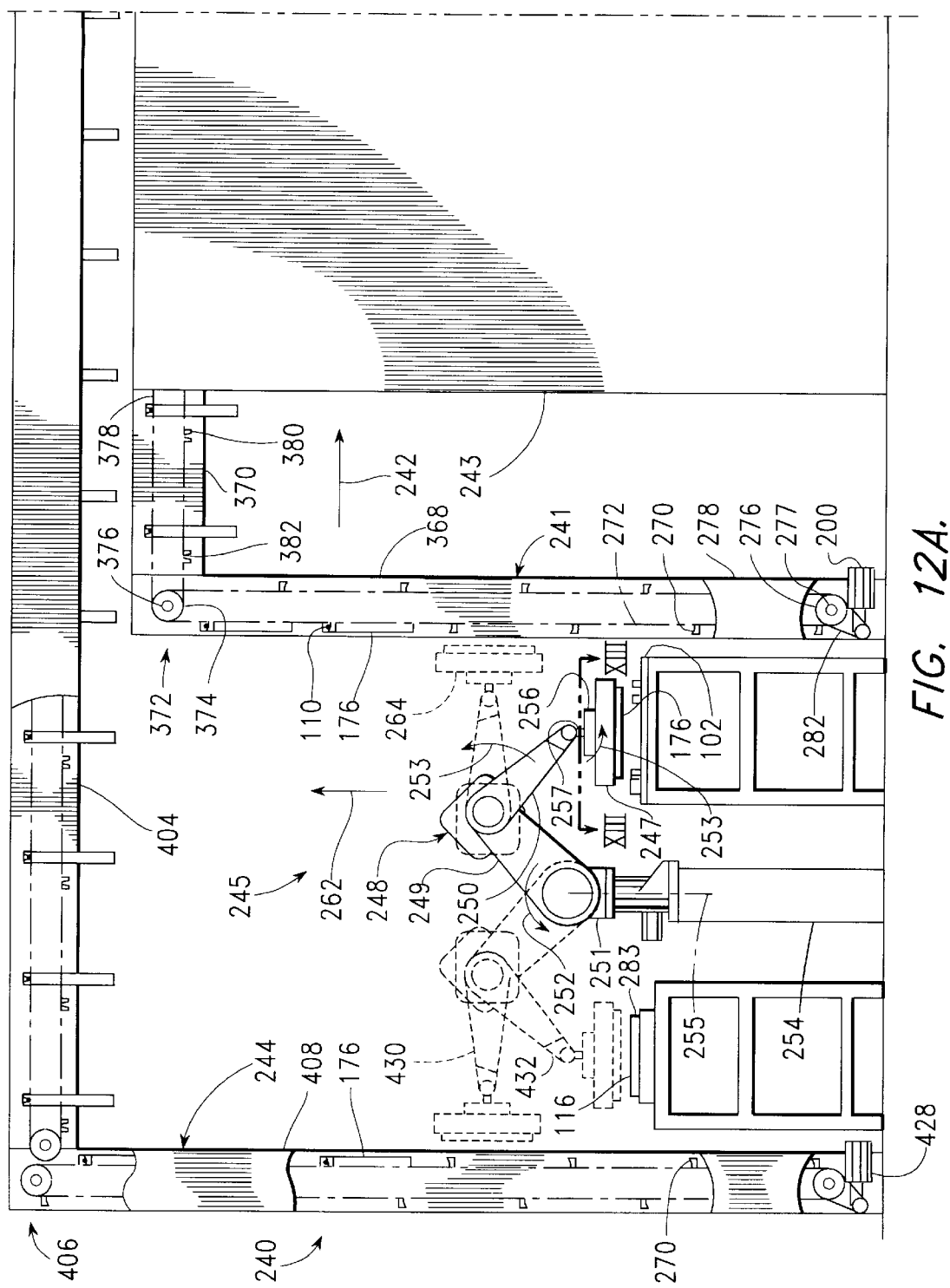
FIG. 12A is a first portion of FIG. 12, showing a loading station in the conveyor system thereof.

FIG. 12A is a first portion of FIG. 12, showing particularly a fixture loading station 245 used to unload empty fixtures 176 from the upper conveyor 244, to load flexible sheets 116 onto these carrying fixtures 176, and to load the fixtures 176, having been thus loaded with sheets 116, onto the lower conveyor 241 to be carried through the manufacturing processes 243.

Figure 12B:
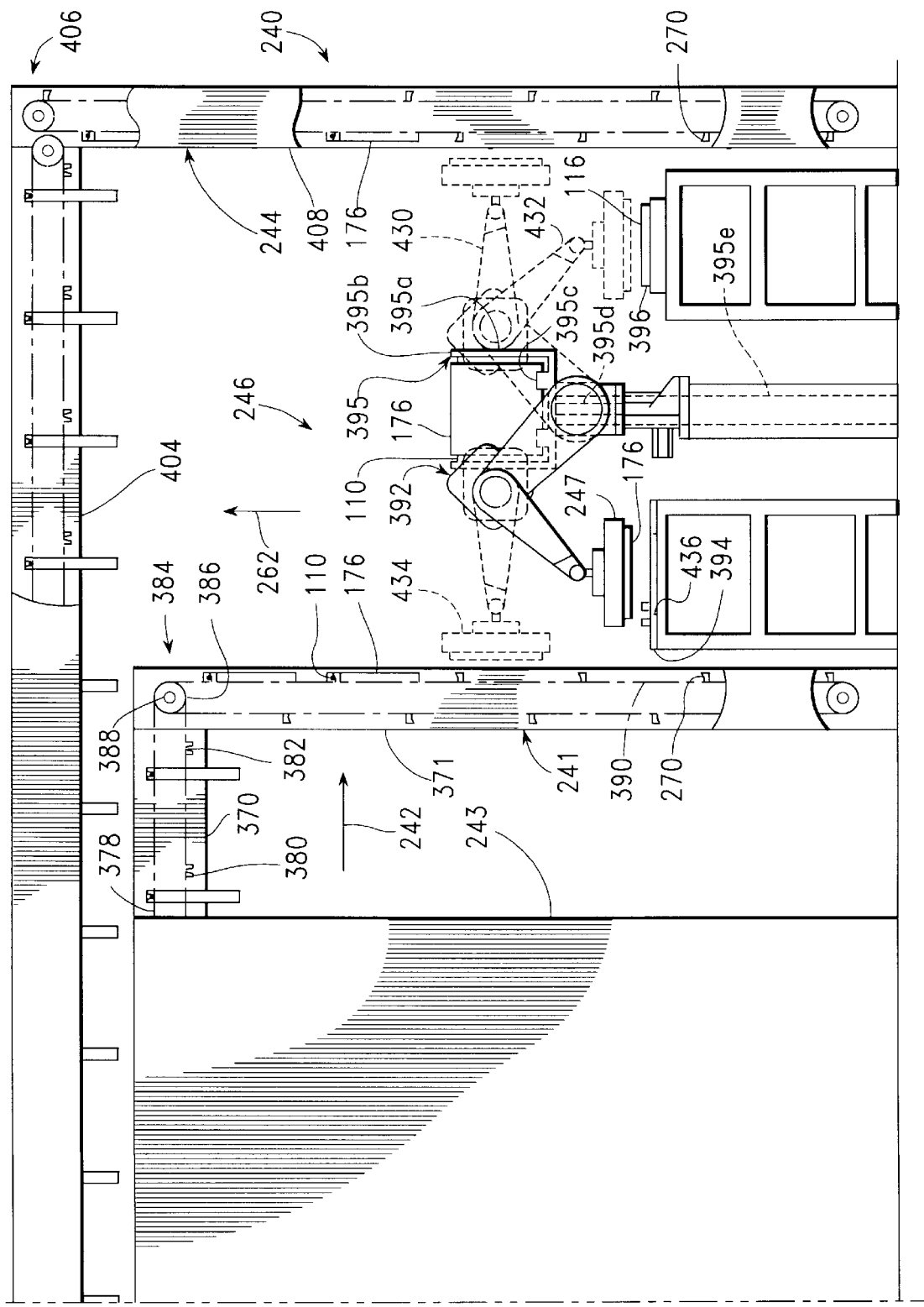
FIG. 12B is a second portion of FIG. 12, showing an unloading station in the conveyor system thereof.

FIG. 12B is a second portion of FIG. 12, showing particularly a fixture unloading station 246 used to unload fixtures 176 from the lower conveyor 241, to remove processed flexible sheets 116 from these fixtures 176, and to load these fixtures 176 onto the upper conveyor 244 for reuse.

Referring to FIG. 12A, the fixture loading station 245 includes a loading fixture 102, which has been described above in reference to FIG. 6, and a frame transport fixture 247, which is mounted at the end of a robot arm 248. The robot arm 248 is of a general type which is well known to those skilled in the art, being articulated to include a proximal arm segment 249 and a distal arm segment 250. The proximal arm segment is mounted on a base portion 251 to pivot thereon in and opposite the direction indicated by arrow 252. The distal arm segment 250 is mounted on the proximal arm segment 249 to pivot thereon in and opposite the direction indicated by arrow 253. The base portion 251 is mounted on a pedestal 254 to rotate about a central vertical axis 255. The frame transport fixture 247 is mounted to pivot in and opposite the direction of arrow 256 and about the axis of mounting shaft 257 on distal arm segment 250. These pivoting movements, which are made in response to instructions in a program executing in a computer system (not shown) driving the robot arm 248, are used, for example, to pick up a loaded carrying fixture 176 with the transport fixture 247, by vertical movement in the direction of arrow 262, to rotate the transport fixture 247 into the position indicated by dashed lines 264, and to move the transport fixture 247 horizontally, in the direction of arrow 242, so that the pins 110 of the carrying fixture 176 within the transport fixture 247 are engaged by a pair of vertical transport plates 270 moving with a pair of lifting chains 272 forming a part of the lower conveyor 241. These lifting chains 272 are driven to move the carrying fixtures 176 attached thereto upward, in the direction of arrow 262. These lifting chains move in engagement with a pair of drive sprockets 276 on a shaft 277, which is rotatably mounted in a pair of upstanding sideplates 278, the nearer of which is shown as cut away for clarity. The shaft 277 is in turn rotationally driven by a gear motor 280 through a chain drive 282. The various movements of frame transport fixture 247, which are made available through the use of robot arm 248, allow the transport fixture 247 to be moved among various locations, such as a stack 283 of unprocessed flexible sheets 116, the loading fixture 102, the lower conveyor 241, and the upper conveyor 244.

Figure 13:
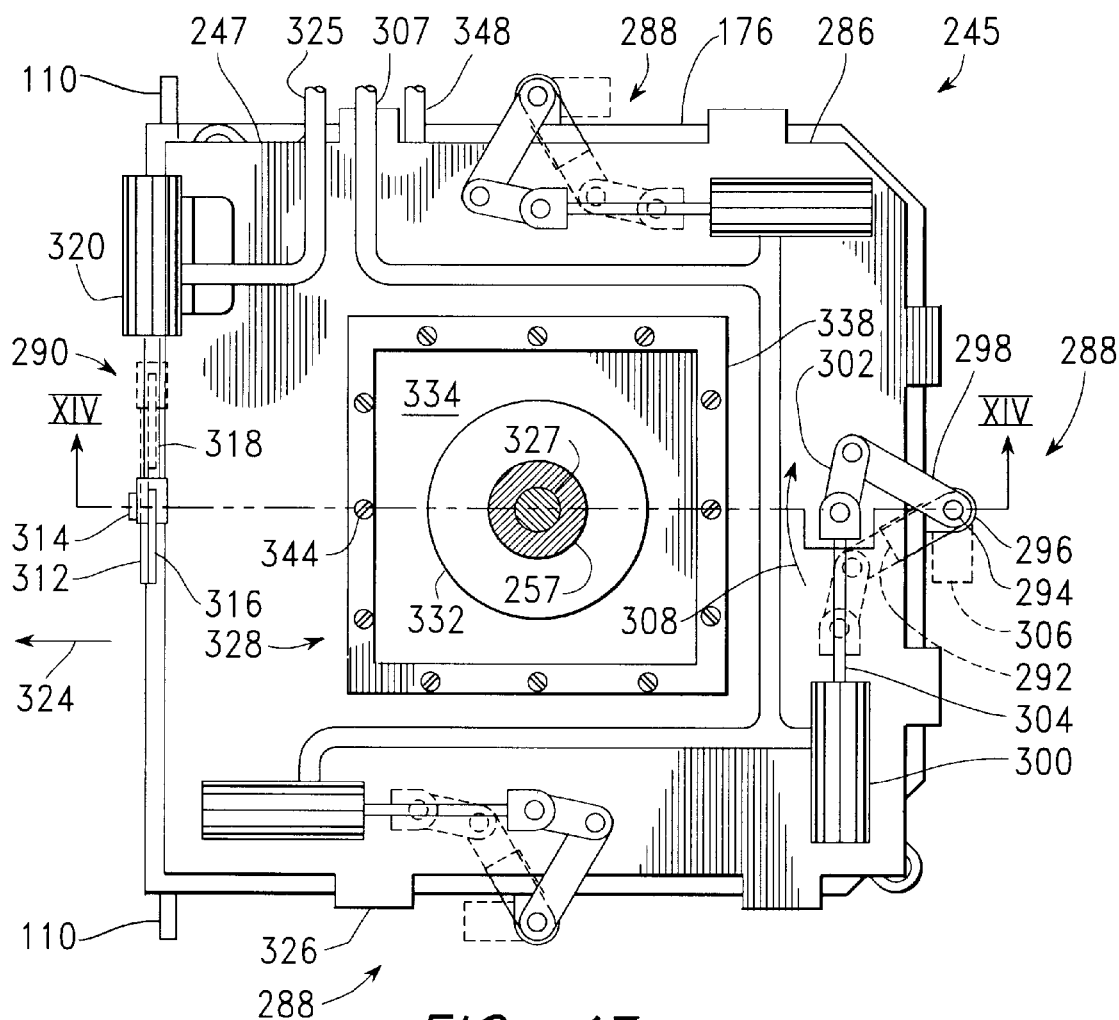
FIG. 13 is a fragmentary cross-sectional plan view of the loading station of FIG. 12A, taken as indicated by section lines XIII—XIII therein to show a transport fixture in the loading station thereof.

FIG. 13 is a fragmentary cross-sectional plan view of the fixture loading station 245, taken as indicated by section lines XIII—XIII in FIG. 12A to show the frame transport fixture 247. This fixture 247 is configured for releasably engaging a flexible sheet 116 (shown in FIG. 8), for releasably engaging a carrying fixture 176, for applying a flexible sheet 116 to a carrying fixture 176, and for removing a flexible sheet 116 therefrom.

Figure 14:
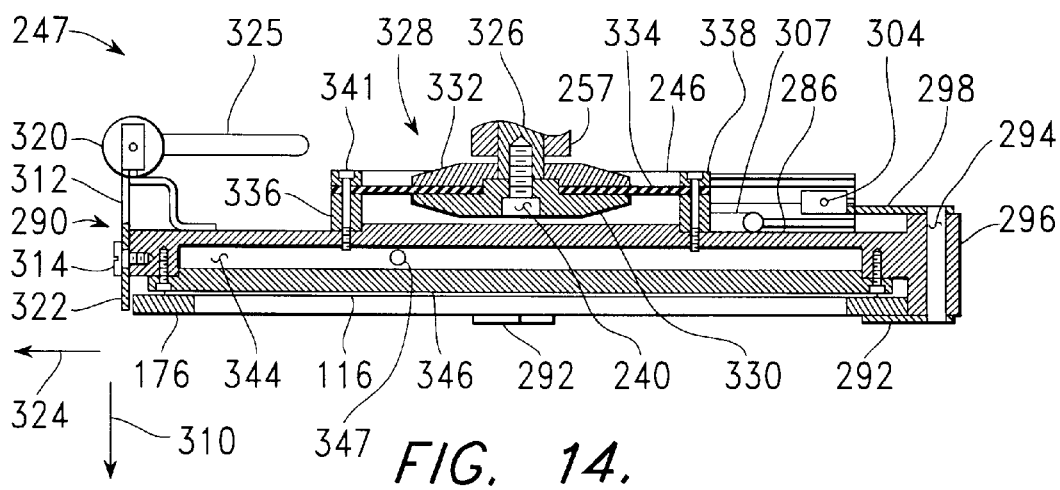
FIG. 14 is a cross-sectional elevation of the transport fixture of FIG. 13, taken as indicated by section lines XIV—XIV therein.

FIG. 14 is a cross-sectional elevation of the frame transport fixture 247, taken as indicated by section lines XIV—XIV in FIG. 13.

Referring to FIGS. 13 and 14, the transport fixture 247 includes a frame 286 having three clamping mechanisms 288 and a single stopping mechanism 290, all of which co-operate to keep a loading fixture 176 in place on the transport fixture 247. Each clamping mechanism 288 includes a clamping arm 292 which is attached to a shaft 294 pivotally mounted within a bearing block 296 extending as a portion of the frame 286. A drive arm 298, also attached to the shaft 294, is connected to a pneumatic actuator 300 by means of a connecting link 302 pivotally attached to both the drive arm 298 and to a rod 304 extending from the actuator 300. When air under pressure is applied to each actuator 300, its associated rod 304 is pulled into the actuator 300, moving the associated linkage into the configuration shown by dashed lines 306. A hose assembly 307 is used to apply air under pressure to the three actuators 300 and to exhaust air therefrom. Each actuator 300 includes an internal spring pushing the rod 304 outward. When the rod 304 is in its extended, the clamping arm 292 is rotated in the direction of arrow 308 so that a loading fixture 176 being carried with the transport fixture 247 cannot be removed in the direction of arrow 310. When air under pressure is applied to each actuator 300, the rod 304 is retracted into each actuator 300, moving the linkages into the configuration indicated with dashed lines 306, allowing the removal of the carrying fixture 176 in the direction of arrow 310. Furthermore, with air applied to the actuators 300, a transport fixture 288 without a carrying fixture 176 can be lowered onto a carrying fixture 176 which is to be picked up for subsequent movement.

The stopping mechanism 290 includes a stopping crank 312, pivotally mounted on the frame 286 by means of a pivot screw 314, which is connected, by means of a pivotally mounted connecting link 316, to a rod 318 extending from a pneumatic actuator 320. When the pneumatic actuator 320 is exhausted to the atmosphere, a lower tip 322 of stopping crank 312 is held in a position blocking the outward movement of carrying fixture 176 in the direction of arrow 324. When air under pressure is applied to the pneumatic actuator 320, stopping crank 312 is rotated so that lower tip 322 is no longer interposed adjacent the carrying fixture 176, allowing this fixture to be removed in the direction of arrow 324. A hose 325 is used to apply air under pressure to the pneumatic actuator 320 and to exhaust air therefrom. Furthermore, with pressurized air applied to the actuator 320 of the transport fixture 247 when it is not holding a carrying fixture 176, such a fixture 176 may be inserted therein in the direction opposite that of arrow 324.

The frame 286 also includes a number of outward- and downward-extending sections 326, which are aligned along the sides having clamping mechanisms 288, so that a carrying fixture 176 is held in an accurate position within the transport fixture 247, despite movements of the transport fixture 247. The absence of a section 326 on the remaining side allows a carrying fixture 176 to be removed in the direction of arrow 324 when air is applied to the actuator 320 through hose 325.

The frame 286 is attached to the robot arm 248 (shown in FIG. 12) by means of an inner shaft 327, pivoting within a mounting shaft 257. The inner shaft 327 is attached to the frame 286 through a flexible adapter 328 including a lower clamping hub 330, an upper clamping hub 332, an elastomeric sheet 334, a lower clamping frame 336, and an upper clamping frame 338. The lower clamping hub 330 is attached to the inner shaft 327 by means of a central clamping screw 340, with a central annular portion of the elastomeric sheet 334 being clamped between the lower clamping hub 330 and the upper clamping hub 332. A peripheral portion of the elastomeric sheet 334 is clamped between the lower clamping frame 336 and the upper clamping frame 338, which are both attached to frame 286 by means of a number of peripheral clamping screws 341.

Thus, the transport fixture 247 is mounted to the robot arm 248 in a flexible manner allowing the placement of the transport fixture 247 in contact atop a carrying fixture 176 on the loading fixture 102 and other surfaces despite minor variations in flatness, leveling, etc.

Continuing to refer to FIGS. 13 and 14, and referring additionally to FIG. 6, the loading fixture 102 and the transport fixture 247 are configured to allow placement of a transport fixture 247 holding a carrying fixture 176 on the loading fixture 102. Thus, the loading fixture 102 includes cavities 342 providing clearance around the clamping arms 292 in both their open and closed positions, and a corner 343 of the transport fixture 247 is shaped to prevent interference with the movement of sliding block 140 as driven in the direction of arrow 130 by actuator 126.

Continuing to refer to FIGS. 13 and 14, the transport fixture 247 also includes a plenum chamber 344 extending under a central portion of the frame 286 and above a plenum plate 346. Provision is made for establishing an airflow through the plenum plate 346, either through the use of a number of small holes (not shown), extending therethrough, or through the porosity of the material of which the plenum plate 346 is composed. The plenum chamber 344 is connected to a vacuum or to the atmosphere through a hole 347 and through a hose 348 extending therefrom. Thus the lower surface of plenum plate 366 is used selectively to pick up a flexible sheet 116, to hold the sheet 116 so that it can be carried from one location to another and to release the sheet 116.

Referring again to FIGS. 12A and 12B, lower conveyor 241 includes a lifting section 368 moving carrying fixtures 176 loaded with flexible sheets 116 upward from the fixture loading station 245, in the direction of arrow 262, a horizontal transport section 370 moving these fixtures 176 through the manufacturing processes 243 in the direction of arrow 242, and a lowering section 371 moving these fixtures 176 downward, opposite the direction of arrow 262, into the fixture unloading station 246.

Each fixture 176 is transferred from the lifting section 368 to the transport section 370 at a first conveyor conveyors in this corner 372, central portion of the conveyors in this corner 372, with the fixtures 176 moving through this central portion, a pair of identical sprockets 374 turn with a rotatably mounted short shaft 376. Thus, each transport chain 378 moves at the same linear speed as the corresponding lifting chain 272, which, as previously described, is driven by a gearmotor 200. Each transport chain 378 includes a number of outward-extending horizontal transport plates 380, each of which includes a central slot 382 for receiving a pin 110 extending outward from a carrying fixture 176. The chains 272, 378 are synchronized so that, whenever a pin 110 of a carrying fixture 176 is carried upward to the periphery of a sprocket 374 by a vertical transport plate 270 on a lifting chain 272, a horizontal transport plate 380 is brought into position by a transport chain 378, so that the slot 382 of the horizontal transport plate 380 accepts the pin 110. The fixture 176 is then carried into the manufacturing process 243 with its pins 110 being held within the slots of a pair of horizontal transport plates 380 by gravity.

Similarly, each carrying fixture 176 is transferred from the transport section 370 to lowering section 371 at a second conveyor corner 384. In this corner, at each side of the central portion of the conveyors, through which the fixtures 176 are moved, a pair of identical sprockets 386 turn with a rotatably mounted short shaft 388. Thus, a pair of lowering chains 390, having a number of vertical transport plates 270, is driven at the same linear speed as the transport chain 378. These chains 380, 390 are synchronized so that, as a pin 110 of a carrying fixture 176 is carried in the direction of arrow 242 to the periphery of a sprocket 386 in the direction of arrow 242, a vertical transport plate 270 is brought into place to accept the pin 170, which is then lowered with the lowering chain 390.

The fixture unloading station 246 includes a robot arm 392, which is similar or, preferably, identical to the robot arm 248 of fixture loading station 245. The robot arm 392 moves a second frame transport fixture 247 between the lower conveyor 241, at which carrying fixtures 176 having processed flexible sheets 116 are received, a fixture plate 394 at which the carrying fixtures 176 are removed from the flexible sheets 116, a stack 396 on which the processed sheets 116 are placed, and upper conveyor 244, at which empty frames 176 are returned for re-use.

In the lower conveyor 241, the transfer of a pin 110 from one conveyor system to another occurs as the pin moves around a quadrant of a pair of sprockets 374, 386. However, in the upper conveyor 244, at third conveyor corner 400, this type of transfer cannot occur, since the pin 110 must be transferred from an inner side of a raising section 402, facing in the direction opposite arrow 242, to the outer side of a horizontal transport section 404, facing upward, in the direction of arrow 262. Similarly, in the upper conveyor 244, at fourth conveyor corner 406, the pin 110 must be transferred from the outer side of the horizontal transport section 404 to an inner side of a lowering section 408.

Figure 15:
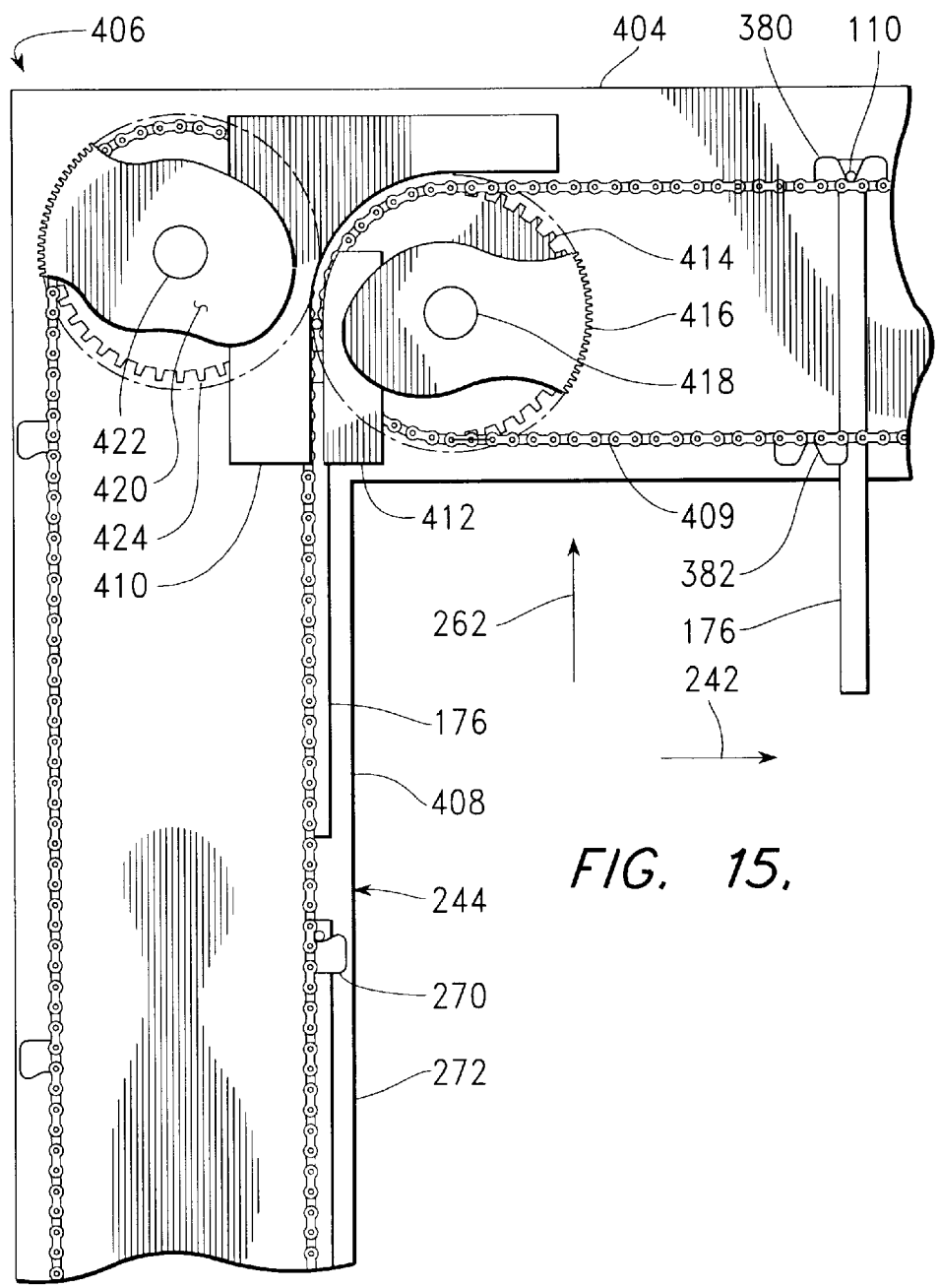
FIG. 15 is a fragmentary elevation of the conveyor system of FIG. 12, showing provisions for transferring carrying fixtures from one portion of the conveyor system to another.

FIG. 15 is an elevational view of the fourth conveyor corner 406. Carrying fixtures 176 reach this corner travelling along horizontal transport section 404 opposite the direction of arrow 242, with their pins 110 being carried in the grooves 382 of horizontal transport plates 380 moving with a pair of horizontal transport chains 409. The pins 110 also extend outward to slide between an outer guide plate 410 and an inner guide plate 412 as they are moved partially around a sprocket 414. Both these guide plates 410, 412 are stationary structures fastened to various structural elements of the upper conveyor 244. On each side of a central portion of the conveyor 244, in which the fixtures 176 move, the sprocket 414 is mounted to turn with a gear 416 on a rotatably mounted shaft 418. Each gear 416 meshingly engages a gear 420 which is mounted on a rotatably mounted shaft 422. The shaft 420 extends across the width of the conveyor system 244, having a gear 420 and a sprocket 424 near each end. A lowering chain 426 extends partly around each sprocket 424, moving in engagement therewith.

Referring to FIGS. 12A and 15, the lowering chains 426 are driven by a gearmotor 428, so that the carrying fixtures 176 moving therewith are moved downward, in the direction opposite arrow 262 to be returned for re-use within the loading station 245. The horizontal transport chains 409 are in turn driven by the meshing engagement of gears 416 and 420.

Continuing to refer to FIGS. 12A and 15, and referring additionally to FIG. 12B, the movement of carrying fixtures 176 around the third conveyor corner 400 is accomplished using elements generally as described relative to fourth conveyor 406. In the example of FIG. 15, guide plates 410, 412 are configured in a manner facilitating the movement of fixtures 176 between the conveyor sections 404, 408 in either direction. Thus, the conveyor systems 240, 241 may be run in reverse, backing fixtures 176 out of jammed areas when required and making troubleshooting easier.

Referring to FIGS. 12A, 13 and 14, the loading station 245 is used to load flexible sheets 116 onto carrying fixtures 176 and subsequently to place the fixtures on the conveyor system 244. The flexible sheets 116 are supplied in a first stack 283, within reach of robot arm 248, and the empty carrying fixtures 176 (without flexible sheets 116) are supplied by means of upper conveyor 244, a portion of which is also within the reach of robot arm 248.

First, the robot arm 248, operating from a position indicated by dashed lines 430, moves opposite the direction of arrow 242 to engage an empty carrying fixture 176, with the tip 322 of stopping crank 312 rotated into an open position by the application of air to the actuator 320, to allow the entry of a carrying fixture 116 into the transport fixture 247, Before or during the process of loading a carrying fixture 116 into the transport fixture 247, the three clamping arms 292 are rotated into closed positions as the actuators 300 are exhausted to the atmosphere through the hose assembly 307, so that a carrying fixture 176 is held thereby. After a carrying fixture 176 is fully placed within the transport fixture 247, air is exhausted from the actuator 320, with the tip 322 of stopping crank 312 being thereby rotated into a closed position to hold the fixture 176 in place.

Next, the robot arm 248 is moved into the position in which it is shown by solid lines over the loading fixture 102, with a carrying fixture 176 held within the transport fixture 247. From this position, the carrying fixture 176 is lowered onto the loading fixture 102. Then, air under pressure is applied to the actuators 300, so that the clamping arms 292 are rotated to release the fixture 176. The transport fixture is moved upward to clear the fixture 176.

Next, the robot arm 248 is moved into the position indicated by dashed lines 432. Operating from this position, the robot arm 248 picks up a flexible sheet 116 from the stack 283 thereof by moving the transport fixture 247 into place above this stack and downward, opposite the direction of arrow 262, onto this stack. A vacuum is next applied to the vacuum plenum 344 through hose 348, so that the flexible sheet 116 at the top of the stack is attached to the lower surface of plenum plate 346.

Continuing to refer to FIGS. 12A, 13, and 14, and referring additionally to FIG. 8, the transport fixture 247 is next moved, with the flexible sheet 116 attached therein by a vacuum being maintained within plenum 344, into position over the carrying fixture 176 which has been placed on the loading fixture 102. (That is, the robot arm 248 is returned to the position in which it is shown by solid lines). Next, air is supplied under pressure to the actuator 126 (shown in FIG. 6) of the loading fixture 102, causing the tensioning member 180 of the carrying fixture 176 to be moved toward the frame member 178 thereof. The transport fixture 247 is again lowered over the carrying fixture 176, with the clamping arms 292 rotated to open positions by the application of air under pressure to the actuators 300. As the transport fixture 247 is fully lowered onto the carrying fixture 176, the lower surface of plenum plate 346 presses the flexible sheet 116 carried thereby against the tacky strips 118 extending along the upper surface 112 of the frame member 178 and the upper surface 114 of the tensioning member 180. This action attaches the flexible sheet 116 to the surfaces of tacky strips 118 with the tensioning member 180 moved toward the frame member 178.

Next, the actuator 126 is exhausted to the atmosphere, allowing the tensioning member 180 to return away from the frame member 178, air under pressure is again applied to the three actuators 300, so that the three clamping arms 292 are rotated into closed positions to hold the carrying fixture 176 in place within the transport fixture 247, air under atmospheric pressure is restored to the vacuum plenum 344, and the transport fixture 247 is lifted, relieving the mechanical pressure holding the lower surface of plenum plate 346 against the flexible sheet 176. With these actions, as the tensioning member 180 moves away from the frame member 178, tensioning forces are applied to the flexible sheet 116.

Next, the robot arm 248 is moved into the position indicated by dashed lines 264, with the transport fixture 247 adjacent the lower conveyor 241. Air under pressure is applied to the actuator 320 so that the stopping arm tip 322 is rotated into an open position, allowing the carrying fixture 176 to be moved upward, out of the transport fixture 247. The robot arm moves the transport fixture 247 in the direction of arrow 242 so that the pins, 110 are engaged by an upward-moving vertical transport plate 270 of the lifting chain 272.

As the carrying fixture 176 is lifted away from the transport fixture 247, the processes associated with loading a single flexible sheet 116 into a single carrying fixture 176 are completed, and the robot arm is returned to the position indicated by dashed lines 430 to repeat these processes for a next flexible sheet 116 and a next carrying fixture 176. The motion of the lower conveyor 241 may be used to lift the carrying fixture 176 free of the clamping arms 292 with these arms 292 in their closed position, or these arms 292 may be opened to allow the process of moving the transport fixture 247 away from the lower conveyor 241 opposite the direction of arrow 242 to occur sooner. Similarly, the motion of upper conveyor 244 may be used to move an empty carrying fixture 176 downward into the transport fixture 247 with these clamping arms 292 in their closed position, or the process of moving the transport fixture 247 toward the upper conveyor 244 may occur later, with these clamping arms 292 in their open position.

Referring to FIGS. 12B, 13, and 14, the unloading station 246 is used to unload flexible sheets 116 from carrying fixtures 176 supplied through lower conveyor 241 and subsequently to place the fixtures thus emptied onto upper conveyor 244. The flexible sheets 116 are placed in a stack 396, within reach of the robot arm 392.

First, the robot arm 392, operating from a position indicated by dashed lines 434 moves its transport fixture 247 opposite the direction of arrow 242 to engage a loaded carrying fixture 176. As described above relative to the first step in the operation of the loading station 245, the clamping arms 292 of the transport fixture 247 may be open or closed as the transport fixture is moved toward the conveyor, but these arms 292 must be closed as the transport fixture 276 is moved away from the conveyor 241 in the direction of arrow 242.

Since the conveyor system 241 has not reversed the orientation of the carrying fixture 176, the carrying fixture arrives at unloading station 246 having its associated flexible sheet 116 facing in the direction opposite that of arrow 242. This orientation causes the flexible sheet to be under, rather than above, the carrying fixture 176 with subsequent movement of the robot arm, for example, into the position in which it is shown with solid lines above unloading fixture 394.

Therefore, to facilitate unloading the flexible sheet from the carrying fixture 176 at the unloading fixture 394, the orientation of the flexible sheet 116 is reversed in a reversing fixture 395 after being removed from the conveyor 241. The robot arm 392 moves from the position indicated by dashed lines 434 into a position (not shown) at which the loading fixture 394 is placed into the reversing fixture 395. This fixture 395 includes a "U"-shaped frame 395a with slotted upper surfaces 395b into which the pins 110 of the carrying fixture 176 are placed. The reversing fixture 395 may also include additional guiding surfaces 395c holding the carrying fixture 176 in place. The method for placing the carrying fixture 176 within the reversing fixture 395 through the operation of robot arm 392 and transport fixture 247 is preferably similar to the method used to place a carrying fixture 176 on either conveyor system 240, 241. After the carrying fixture 176 is loaded into the reversing fixture 395 and disengaged from the transport fixture 247, the reversing fixture 395 is rotated through a 180-degree angle about the axis of a vertical mounting shaft 395d extending into a pedestal 395e, reversing the orientation of the carrying fixture 176. Next, the re-oriented carrying fixture 176 is picked up by the transport fixture 247, preferably using a method similar to that employed in placing a carrying fixture 176 on either conveyor system 240, 241.

Next, the robot arm 392 is moved into a position indicated by the solid lines, over the fixture plate 394. The transport fixture 247 is moved downward to the fixture plate, and a vacuum is applied to its plenum chamber 344 through an associated hose 348. Air under pressure is applied to the three actuators 300, so that the clamping arms 292 are moved into open positions. The transport fixture 247 is then moved upward, with the flexible sheet 116 attached to the underside of plenum wall 346 by means of the applied vacuum. The separation of the flexible sheet 116 from the tacky surfaces of the strips 116 extending along the upper surfaces of the carrying fixture 176 is preferably aided by air flowing through a central aperture 436 in the fixture plate 394 to push on the centrally-exposed lower surface of the flexible sheet 116. As the transport fixture moves upward, the carrying fixture 176 remains on the fixture plate 394, being held by its own weight, by a latching or detent mechanism (not shown) fastened to the fixture plate 394 to engage the carrying fixture 176 when it is lowered to the fixture plate. An alternate method for facilitating the separation of the flexible sheet 116 from the tacky surfaces of strips 118 will be discussed in reference to FIG. 16.

The robot arm 392 is next moved to the position indicated by dashed lines 438, with the transport fixture 247 holding the transparent sheet 116 over the stack 396 of such processed transparent sheets. The transport fixture 247 is then lowered toward the stack 396, as the transparent sheet 116 is released from this fixture 247 by exhausting the vacuum plenum 344 to the atmosphere. Alternately, air under pressure may be directed into the plenum 344 to assist in the separation of the transparent sheet 116 from the lower surface of plenum wall 346.

The robot arm 392 is next returned to the position in which it is indicated by solid lines, with the transport fixture 247 over the fixture plate 436. From this position, the transport fixture 247 is lowered over the carrying fixture 176, which has previously been placed on the fixture plate 436. The transport fixture 247 is lowered with the clamping arms 292 rotated into open positions. When this downward movement is completed, these clamping arms 292 are rotated into closed positions to engage the carrying fixture 176, which is then raised from the fixture plate 436 with upward movement of the transport fixture 247.

At this point, the orientation of the carrying fixture 176 is again reversed, so that the attachment surface provided by tacky strips 118 is correctly located when the fixture 176 is returned to loading station 245. Thus, the carrying fixture 176 is returned, using robot arm 392 and transport fixture 247, to the reversing fixture 395 in which the fixture 176 is rotated through a 180-degree angle.

After removing the carrying fixture 176 from the reversing fixture 395, the robot arm 392 is moved into the position indicated by dashed lines 440, with the transport fixture 247 facing the upper conveyor 244. Air under pressure is applied to the actuator 320 so that the stopping arm tip 322 is rotated into an open position, allowing the carrying fixture 176 to be moved upward, out of the transport fixture 247. The robot arm 392 moves the transport fixture 247 in the direction of arrow 242 so that the pins 110 are engaged by an upward-moving vertical transport plate 270 within the upper conveyor 244.

As the carrying fixture 176 is lifted away from the transport fixture 247, the processes associated with unloading a single flexible sheet 116 from a single carrying fixture 176 are completed, and the robot arm 392 is returned to the position indicated by dashed lines 434 to repeat these processes for a next carrying fixture 176 to place a next flexible sheet 116 onto the stack 396. The motion of the outer conveyor 244 may be used to lift the carrying fixture 176 free of the clamping arms 292 with these arms 292 in their closed position, or these arms 292 may be opened to allow the process of moving the transport fixture 247 away from the outer conveyor 244 opposite the direction of arrow 242 to occur sooner. Similarly, the motion of lower conveyor 241 may be used to move an empty carrying fixture 176 downward into the transport fixture 247 with these clamping arms 292 in their closed position, or the process of moving the transport fixture 247 toward the lower conveyor 241 may occur later, with these clamping arms 292 in their open position.

The exemplary method described above, a single reversing fixture 395 is used twice for each carrying fixture 176 moved through the system. Both of these reversals occur in the unloading station 246, making optimal use of the reversing fixture 395. Alternately, a reversing fixture 395 may additionally be placed in the loading station 245, with each reversing fixture being used only once for each carrying fixture 176 moving through the system. This method may be more desirable for processes having cycle times so fast that a single reversing fixture used twice limits the speed at which the conveyor systems can be operated. Alternately, a system for reversing the carrying fixtures 176 may be built into one or both of the conveyor systems 240, 241.

Figure 16:
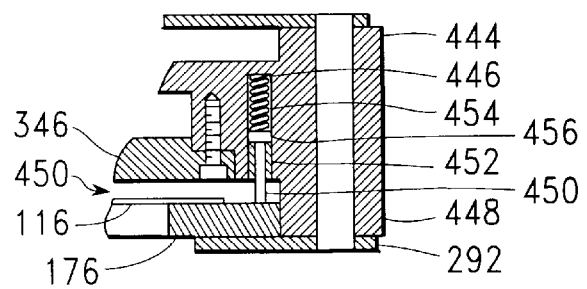
FIG. 16 is a fragmentary elevation of an alternative transport fixture for use in the loading station of FIG. 12A and in the unloading station of FIG. 12B.

FIG. 16 is a fragmentary transverse cross-sectional view of an alternative transport fixture 444, which is similar to the transport fixture 247, previously described in reference to FIGS. 13 and 14, except that, in the transport fixture 444, a number of spring assemblies 446 are included in the frame 448, being located in a peripheral pattern to push downward on the carrying fixture 176 outside the flexible sheet 116, and the distance between the lower plenum plate 346 and the clamping cranks 292 has been increased to allow the formation of a substantial gap 450 between the upper surfaces of the carrying fixture 116 and the plenum plate 346.

Referring to FIGS. 12A, and 16, each spring assembly 446 includes a tip 450, sliding along an inner surface of a cylinder 452 with a force applied by a compression spring 454. The movement of each sliding tip 450 is stopped when a flange 456 thereof strikes an adjacent end of the cylinder 452. Preferably, the motion of each tip 450 is limited to a distance allowing the carrying fixture 176 to move freely between the surfaces of the tips 450 and the clamping cranks 292 when it is inserted therein or removed therefrom by vertical transport plates of a conveyor 241, 244.

Referring to FIGS. 6, 8, 12A, and 16, in the loading station 245 (shown in FIG. 12A), the use of the alternative transport fixture 444 provides a means for holding the upper surface of the carrying fixture 176 in a spaced-apart relationship with the lower surface of plenum plate 346. Therefore, with the flexible sheet 116 held in place on the lower surface of plenum plate 346, the carrying fixture 176 may be set up, with the tensioning member 180 being moved toward the frame member 178 by means of the actuator 126 on loading fixture 102, with the flexible sheet 116 being held away from the tacky surfaces of strips 118. Thus, the processes occurring within the loading station 245 can be simplified by picking up the flexible sheet 116 before the empty carrying fixture, and by holding the flexible sheet 116 in attachment with the the lower surface of plenum plate 346 as the tensioning member 180 is moved toward the frame member 178, with the carrying fixture 176 within both the loading fixture 102 and the transport fixture 247.

To take advantage of this capability in the loading station 245, the robot arm 248 is first moved into the position shown by dashed lines 432, from which the transport fixture 444 is lowered to pick up an unprocessed sheet 116 at the top of stack 283. The vacuum plenum 344 within the transport fixture 444 is next evacuated through the hose 348, so that the uppermost sheet 116 in the stack 283 becomes attached to the lower surface of the plenum plate 346.

Next, the transport fixture 444 is raised, and the robot arm 248 is moved to the position indicated by dashed lines 430. The transport fixture 444 is moved opposite the direction of arrow 242 to engage an empty carrying fixture moving downward in upper conveyor 244.

Next, the robot arm 248 is moved into the position in which it is indicated with solid lines in FIG. 12A, with the transport fixture 444 over the loading fixture 102, holding both the flexible sheet 116 and the carrying fixture 176, and with the clamping arms 292 rotated into closed positions to hold. The transport fixture 444 is first lowered into a position in which the carrying fixture 176 rests on the surface of the loading fixture 103. Next, the actuator 126 is operated to move the tensioning member 180 toward the frame member 178. Then, the transport fixture 444 is again lowered, compressing the springs 454 in spring assemblies 446, so that the gap 450 is closed. This action presses adjacent portions of the lower surface of the flexible sheet 116 against the tacky upper surfaces of strips 118. To facilitate the transfer of the flexible sheet 116 from the lower surface of plenum wall 346 to the carrying fixture 176. The actuator 126 is released, so that tension is applied to the flexible sheet 116 by the partial return movement of the tensioning member 180. The transport fixture 444 is moved upward, allowing the spring assemblies 446 to re-establish the gap 450, with the flexible sheet 116 being held by the tacky surfaces of strips 118.

Next, the transport fixture 444 is raised, and the robot arm 248 is moved to the position indicated by dashed lines 264. The transport fixture 444 is moved in the direction of arrow 242 to be engaged by a vertical transport plate 270 moving upward in lower conveyor 241.

With this version of the processes occurring in the loading station 245, the carrying fixture 176 remains in place within the transport fixture 244 from the time it is placed therein by the outer conveyor 244 until the time it is picked up by the inner conveyor 241. If the motions produced by vertical transport plates 270 of the conveyors are used in an exclusive manner to place the carrying fixture 176 into the transport fixture 244 and to remove it therefrom, without concurrent horizontal motion of the transport fixture 444, the clamping cranks 292 and their associated mechanisms 288 may be replaced by stationary ledges forming a pocket into which the carrying fixture 176 is inserted with a downward motion, and from which it is removed with an upward motion.

Referring to FIGS. 12B and 16, in the unloading station 246, the use of alternate transport fixture 444 facilitates the transfer of the flexible sheet 116 from the carrying fixture 176, to which it is held by the tacky surfaces of strips 118, to the lower surface of plenum plate 346. The force provided by the spring assemblies 446 increases the force available to cause the separation of the tacky surfaces of the strips 118 from the flexible sheet 116, preventing the carrying fixture 176 from being picked up with the flexible sheet 116 being adhered to both the lower surface of plenum plate 346 and the tacky surfaces of strips 118.

While the preceding discussion has been directed particularly toward the movement of carrying fixtures 176 (shown in FIG. 8) through various processes, it is understood that other versions of carrier fixtures could be handled as well. For example, the carrying fixtures 100 (shown in FIG. 6) may be carried in the apparatus of FIGS. 12A and 12B, instead of, or even along with, the carrying fixtures 176. Furthermore, a substitution of the loading fixture 46 (shown in FIGS. 2–4) for the loading fixture 102 in FIG. 12A forms a system operating with the carrying fixtures 10 (shown in FIG. 1).

Referring to FIGS. 12A and 12B, while the lower conveyor system 241 is shown as entering and leaving an area 243 where various manufacturing processes are applied to the flexible sheets 116, it is understood that this lower conveyor system 241 may be interrupted, forming part of a conveyor system having a number of components removing the carrying fixtures 176 from their connections with horizontal transport plates 380, conveying these fixtures 176, with flexible sheets 116 attached thereto, among various processing stations, and replacing these fixtures 176 on the horizontal transport plates 380 for continued movement to the unloading station 246. The conveyor systems 240, 241 may be driven continuously or in an intermittent fashion.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. A method for transporting a plurality of flexible sheets through a manufacturing process, wherein said method comprises the steps of:

a) removing a carrying fixture for holding a flexible sheet within said plurality thereof from a first conveyor system, to which said carrying fixture is removably attached by means of an attachment member thereof, with said carrying fixture being removed at a first location of said first conveyor system;

b) adhering a flexible sheet within said plurality thereof to an attachment surface of said carrying fixture;

c) placing said carrying fixture, with said flexible sheet adhered thereto, on a second conveyor system, to which said carrying fixture is removably attached by said attachment member thereof;

d) moving said carrying fixture, with said flexible sheet adhered thereto, into a station where said manufacturing process is performed on said flexible sheet;

e) removing said carrying fixture, with said flexible sheet adhered thereto, from said second conveyor system;

f) removing said flexible sheet from said carrying fixture; and g) returning said carrying fixture by means of said first conveyor system to said first location thereof.

2. The method of claim 1, wherein said step b) includes the steps of:

moving a first tensioning member of said carrying fixture from an undeflected position to a deflected position, in which energy is stored for tensioning said flexible sheet;

pressing said flexible sheet against said attachment surface while said tensioning member is held in said deflected position, with said flexible sheet being adhered to said attachment surface by means of a tacky coating extending on said attachment surface; and releasing said first tensioning member to return toward said undeflected position, whereby a portion said energy stored for tensioning applies a tensioning force to said flexible member.

3. The method of claim 2, wherein said attachment surface includes a flat first attachment surface extending along a frame member of said carrying fixture, and a flat second attachment surface extending along said tensioning member of said carrying fixture, with said first and second attachment surfaces being aligned in a common plane, and said first tensioning member is moved in directions parallel to said common plane.

4. The method of claim 3, wherein said first and second attachment surfaces are each "L" shaped, extending around the periphery of a flexible sheet placed thereon, and said first tensioning member is moved along a diagonal extending from a corner of said first attachment surface and a corner of said second tensioning member.

5. The method of claim 2, wherein said step of moving a first tensioning member is preceded by adhering said flexible sheet to a vacuum plenum wall of a transport fixture, and said step of pressing said flexible sheet against said attachment surface occurs as said vacuum plenum wall is pressed against said attachment surface with said tensioning member extending therebetween.

6. The method of claim 1, additionally comprising, between steps a) and b), the steps of:

placing said carrying fixture on a loading fixture with said attachment surface facing upward;

adhering said flexible sheet to a vacuum plenum wall; and moving said vacuum plenum so that said flexible sheet is moved into place above said loading transport fixture, with said step b) including movement of said vacuum plenum to press said flexible sheet onto said attachment surface.

7. The method of claim 6, wherein said vacuum plenum is formed as a portion of a transport fixture, with said transport fixture additionally including fixture engaging means for releasably holding said carrying fixture, with said vacuum plenum extending adjacent a central portion of said fixture engaging means; and said transport fixture is moved among various positions be a robot arm in response to a program operating in a computing system.

8. The method of claim 1, additionally comprising, between steps a) and b), the steps of:

placing said carrying fixture on a loading fixture with said attachment surface facing upward;

adhering said flexible sheet to a vacuum plenum wall; and moving said vacuum plenum so that said flexible sheet is moved into place above said loading transport fixture, with said step b) including movement of said vacuum plenum to press said flexible sheet onto said attachment surface.

9. The method of claim 1, wherein said flexible sheet and said carrying fixture are moved between said first and second conveyor systems by means of a transport fixture attached to a distal end of a robot arm, with said carrying fixture being carried within fixture carrying means forming a portion of said transport fixture, and with said flexible sheet being adhered to a vacuum plenum wall within said transport fixture, adjacent a central portion of said fixture carrying means, and said step a) is preceded by the step of adhering said flexible sheet to said vacuum plenum wall.

10. The method of claim 9, wherein said carrying fixture is held within said fixture carrying means to move between an extended position, in which a gap is provided between said flexible sheet attached to said vacuum plenum wall, and a retracted position, in which said flexible sheet attached to said vacuum plenum wall is pressed against said attachment surface, and wherein said step b) includes the steps of:

moving said transport fixture from said first conveyor system to a loading fixture with said carrying fixture in said extended position; and moving said carrying fixture into said retracted position by moving said transport fixture into contact with said loading fixture.

11. The method of claim 10, wherein said step b) additionally includes the steps of:

moving a first tensioning member of said carrying fixture from an undeflected position to a deflected position, in which energy is stored for tensioning said flexible sheet, before moving said carrying fixture into said retracted position;

moving said carrying fixture into said extended position by moving said transport fixture away from said loading fixture, after moving said carrying fixture into said retracted position; and releasing said first tensioning member to return toward said undeflected position, whereby a portion said energy stored for tensioning applies a tensioning force to said flexible member.

12. The method of claim 1, wherein said steps a, b, and c occur within a loading station, and said steps e and f occur within an unloading station, with said loading and unloading stations at opposite sides of a location wherein said manufacturing processes occur.

13. The method of claim 12 wherein, within said loading station, said flexible sheet and said carrying fixture are moved between said first and second conveyor systems by means of a first transport fixture attached to a distal end of a first robot arm, with said carrying fixture being carried within first fixture carrying means forming a portion of said first transport fixture, and with said flexible sheet being adhered to a first vacuum plenum wall within said transport fixture, adjacent a central portion of said first fixture carrying means, and within said unloading station, said flexible sheet and said carrying fixture are moved between said second and first conveyor systems by means of a second transport fixture attached to a distal end of a second robot arm, with said carrying fixture being carried within second fixture carrying means forming a portion of said second transport fixture, and with said flexible sheet being adhered to a second vacuum plenum wall within said transport fixture, adjacent a central portion of said second carrying means.

14. The method of claim 1, wherein said step f) further comprises the steps of:

moving said carrying fixture, with said flexible sheet adhered thereto, to an unloading fixture;

moving a wall of a vacuum plenum into contact with said flexible sheet; and moving said wall of a vacuum plenum, with said flexible sheet attached thereto, away from said carrying fixture, with said carrying fixture remaining on said unloading fixture.

15. The method of claim 1, comprising additionally:

a first reversing step rotating said carrying fixture with said flexible sheet attached thereto through a 180-degree angle, so that a direction faced by said flexible sheet is reversed; and a second reversing step rotating said carrying fixture after removal of said flexible sheet therefrom through a 180-degree angle, so that a direction faced by said attachment surface is reversed.

16. The method of claim 15, wherein said first reversing step occurs between said step e) and said step f), and said second reversing step occurs between said step f) and said step g).

* * * * *